(12) United States Patent
Nagaya et al.

(10) Patent No.: US 10,165,716 B2
(45) Date of Patent: Dec. 25, 2018

(54) SUBSTRATE CONVEYANCE MECHANISM AND COMPONENT MOUNTING METHOD

(71) Applicant: PANASONIC INTELLECTUAL PROPERTY MANAGEMENT CO., LTD., Osaka (JP)

(72) Inventors: Toshihiko Nagaya, Yamanashi (JP); Hiroyuki Fujiwara, Yamanashi (JP); Shigeo Ogata, Yamanashi (JP); Yoshinori Konda, Yamanashi (JP); Yoichi Makino, Yamanashi (JP); Shinji Yamamoto, Yamanashi (JP); Shuuichi Kubota, Yamanashi (JP); Kimio Iizuka, Yamanashi (JP); Koji Sakurai, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 613 days.

(21) Appl. No.: 14/773,097

(22) PCT Filed: Mar. 3, 2014

(86) PCT No.: PCT/JP2014/001144
§ 371 (c)(1),
(2) Date: Sep. 4, 2015

(87) PCT Pub. No.: WO2014/136425
PCT Pub. Date: Sep. 12, 2014

(65) Prior Publication Data
US 2016/0021801 A1 Jan. 21, 2016

(30) Foreign Application Priority Data
Mar. 7, 2013 (JP) .................. 2013-044970

(51) Int. Cl.
H05K 13/00 (2006.01)
B65G 15/24 (2006.01)
H05K 13/04 (2006.01)

(52) U.S. Cl.
CPC ......... *H05K 13/0061* (2013.01); *B65G 15/24* (2013.01); *H05K 13/04* (2013.01)

(58) Field of Classification Search
CPC .......... H05K 13/0061; H05K 13/0069; H05K 13/08; H05K 13/04; H05K 13/0413;
(Continued)

(56) References Cited

U.S. PATENT DOCUMENTS 2,883,033 A * 4/1959 Flynn, Jr. ................. A21B 3/07
198/360
4,823,940 A * 4/1989 Cretser .................. B65G 15/12
198/817
(Continued)

FOREIGN PATENT DOCUMENTS

CN 101374404 A 2/2009
CN 101374405 A 2/2009
(Continued)

OTHER PUBLICATIONS

Office Action issued for U.S. Appl. No. 14/773,052 dated Sep. 23, 2016.
(Continued)

Primary Examiner — Peter DungBa Vo
Assistant Examiner — Jeffrey Carley
(74) Attorney, Agent, or Firm — Pearne & Gordon LLP

(57) ABSTRACT

A substrate conveyance mechanism that includes conveyance units and a working area length change part to easily change the types of substrates to allow substrates of different lengths to be selected to mount electronic components onto the substrate. The conveyance units include a working area
(Continued)

for substrates having different length that are conveyed from a stand-by area, an area length of the working area that is variable in accordance with the length of the substrate, and a stand-by unit corresponding to a stand-by area for the substrate to be carried in to the working area. The working area length change part changes an interval between a commonly used first pulley and one of a plurality of second pulleys selectively used in accordance with the area length of the working area by changing a belt winding path of a conveyance belt wound on the pulleys in the working unit.

5 Claims, 7 Drawing Sheets

(58) Field of Classification Search
CPC .... H05K 13/0452; B65G 15/12; B65G 15/22; B65G 15/24; Y10T 29/53178; Y10T 29/53187; Y10T 29/4913; Y10T 29/53183; Y10T 29/49002; Y10T 29/49131; Y10T 29/5313

See application file for complete search history.

(56) References Cited

U.S. PATENT DOCUMENTS

| | | | | |
|---|---|---|---|---|
| 6,000,123 | A * | 12/1999 | Munezane | H05K 13/0452 29/721 |
| 7,793,772 | B2 * | 9/2010 | Schafer | B65G 47/261 198/460.1 |
| 2006/0283689 | A1 * | 12/2006 | Schiesser | B65G 15/22 198/395 |
| 2009/0049681 | A1 | 2/2009 | Yagi et al. | |
| 2009/0049682 | A1 | 2/2009 | Yagi et al. | |
| 2010/0309484 | A1 | 12/2010 | Yagi et al. | |
| 2015/0114796 | A1 * | 4/2015 | Heuser | B65G 15/22 198/339.1 |

FOREIGN PATENT DOCUMENTS

| | | |
|---|---|---|
| JP | H07-074500 A | 3/1995 |
| JP | H07-74500 A | 3/1995 |
| JP | H08-204387 A | 8/1996 |
| JP | 2008-182041 A | 8/2008 |
| JP | 2009-054620 A | 3/2009 |
| JP | 2009-173433 A | 8/2009 |
| JP | 2010-050401 A | 3/2010 |

OTHER PUBLICATIONS

International Search Report for Application No. PCT/JP2014/001146 dated Apr. 28, 2014.
International Search Report for Application No. PCT/JP2014/001144 dated Apr. 28, 2014.

* cited by examiner

SUBSTRATE CONVEYANCE MECHANISM AND COMPONENT MOUNTING METHOD

TECHNICAL FIELD

The present invention relates to a substrate conveyance mechanism which conveys a substrate on which an electronic component is mounted and a component mounting device which performs a component mounting operation on the substrate which is conveyed by the substrate conveyance mechanism as an object.

BACKGROUND ART

A component mounting line which produces a mounting substrate on which electronic components are mounted includes a plurality of kinds of component mounting devices such as a component mounting device which mounts the electronic components on the substrate. In these component mounting devices, a substrate conveyance mechanism is provided which conveys the substrate as an object of an operation by a transport conveyor from an upstream side device and positions and holds the substrate in a prescribed working position for mounting. As such a substrate conveyance mechanism, there is known a substrate conveyance mechanism having a structure that the transport conveyor is divided into a stand-by area where the substrate carried in from the upstream side waits and a working area where a prescribed mounting operation is performed in order to eliminate a waste waiting time in a conveyance of the substrate to the utmost and improve a productivity (see PTL 1, for instance). In the related art disclosed in an example of the patent literature, three conveyor mechanisms which are respectively individually driven are arranged in series, so that a carrying-in operation and a carrying-out operation of the substrate can be performed irrespective of a state of the substrate.

CITATION LIST

Patent Literature

PTL 1: JP-A-2009-173433

SUMMARY OF INVENTION

Technical Problem

In recent years, a production facility is required to have such versatility as to meet multiple types of substrates. In accordance therewith, a substrate conveyance mechanism is also desired to have an adjusting function by which a plurality of types of substrates having different sizes can be conveyed, positioned and held. Such a substrate conveyance mechanism ordinarily includes a transport conveyor mechanism which mounts the substrates on a conveyance belt to convey the substrates or a clamp mechanism which secures and holds the conveyed substrates on working positions. Accordingly, the transport conveyor mechanism and the clamp mechanism are required which can meet different lengths of the substrates.

However, in the related art including the above-described example of the patent literature, the transport conveyor mechanism or the clamp mechanism of the substrate conveyance mechanism is manufactured in accordance with a prescribed specification from the beginning of a design thereof. Accordingly, when the substrates having different sizes in length are set as objects for working by a single device, a large-scale work is necessary, for instance, the transport conveyor mechanism or the clamp mechanism needs to be replaced by a transport conveyor mechanism or a clamp mechanism different from the original specification. As described above, the usual substrate conveyance mechanism has a problem that it is difficult to change or switch the types of substrates so as to set the plurality of types of substrates having different lengths as the objects for working.

Thus, it is an object of the present invention to provide a substrate conveyance mechanism and a component mounting device which can easily change types of substrates so as to set a plurality of types of substrates having different lengths as objects to be worked.

Solution to Problem

A substrate conveyance mechanism of the present invention is a substrate conveyance mechanism configured of a plurality of conveyance units which convey a substrate by a conveyance belt wound on a plurality of pulleys and are arranged in series, wherein the conveyance units at least include: a working unit which corresponds to a working area where a component mounting operation is performed with a plurality of types of substrates having different sizes of length set as objects, an area length of the working area being variable in accordance with the sizes of length and a stand-by unit corresponding to a stand-by area where the substrate to be carried-in to the working area is allowed to wait, the pulleys of the working unit include a first pulley commonly used when either of the plurality of types of substrates is taken as an object and a plurality of second pulleys which are selectively used in accordance with the sizes of length when only any one of the plurality of types of substrates is taken as an object, and further, a working area length change part that changes an interval between the first pulley and the second pulleys in accordance with the area length of the working area by changing a belt winding form of the conveyance belt having a same belt length and wound on the plurality of pulleys including the first pulley and the second pulleys in the working unit is provided.

A component mounting device of the present invention is a component mounting device used in a component mounting line which mounts an electronic component on a substrate to produce a mounting substrate and performs a component mounting operation to the substrate as an object. The component mounting device includes the above-described substrate conveyance mechanism and a mechanism for a mounting operation which performs the component mounting operation by taking the substrate conveyed by the substrate conveyance mechanism as the object.

Advantageous Effects of Invention

According to the present invention, in the substrate conveyance mechanism including the working unit which corresponds to the working area where the component mounting operation is performed with the plurality of types of substrates having the different sizes of length set as the objects and in which the area length of the working area is variable in accordance with the sizes of length and the stand-by unit corresponding to the stand-by area where the substrate to be carried-in to the working area is allowed to wait, the working unit and the stand-by unit being arranged in series, the structure of the pulleys on which the conveyance belt is wound in the working unit includes the first pulley commonly used when either of the plurality of types of substrates is taken as an object and the plurality of second pulleys which are selectively used in accordance with the sizes of length when only any one of the plurality of types of substrates is taken as an object. Further, in the working unit, the belt winding form of the conveyance belt having the same belt length and wound on the plurality of pulleys including the first pulley and the second pulleys is changed so that the interval between the first pulley and the second pulleys may be changed in accordance with the area length of the working area. Thus, the change of the types of substrates can be easily performed when the plurality of types of substrates having the different lengths are taken as the objects without requiring the exchange of the conveyance unit.

DESCRIPTION OF EMBODIMENTS

Figure 1:
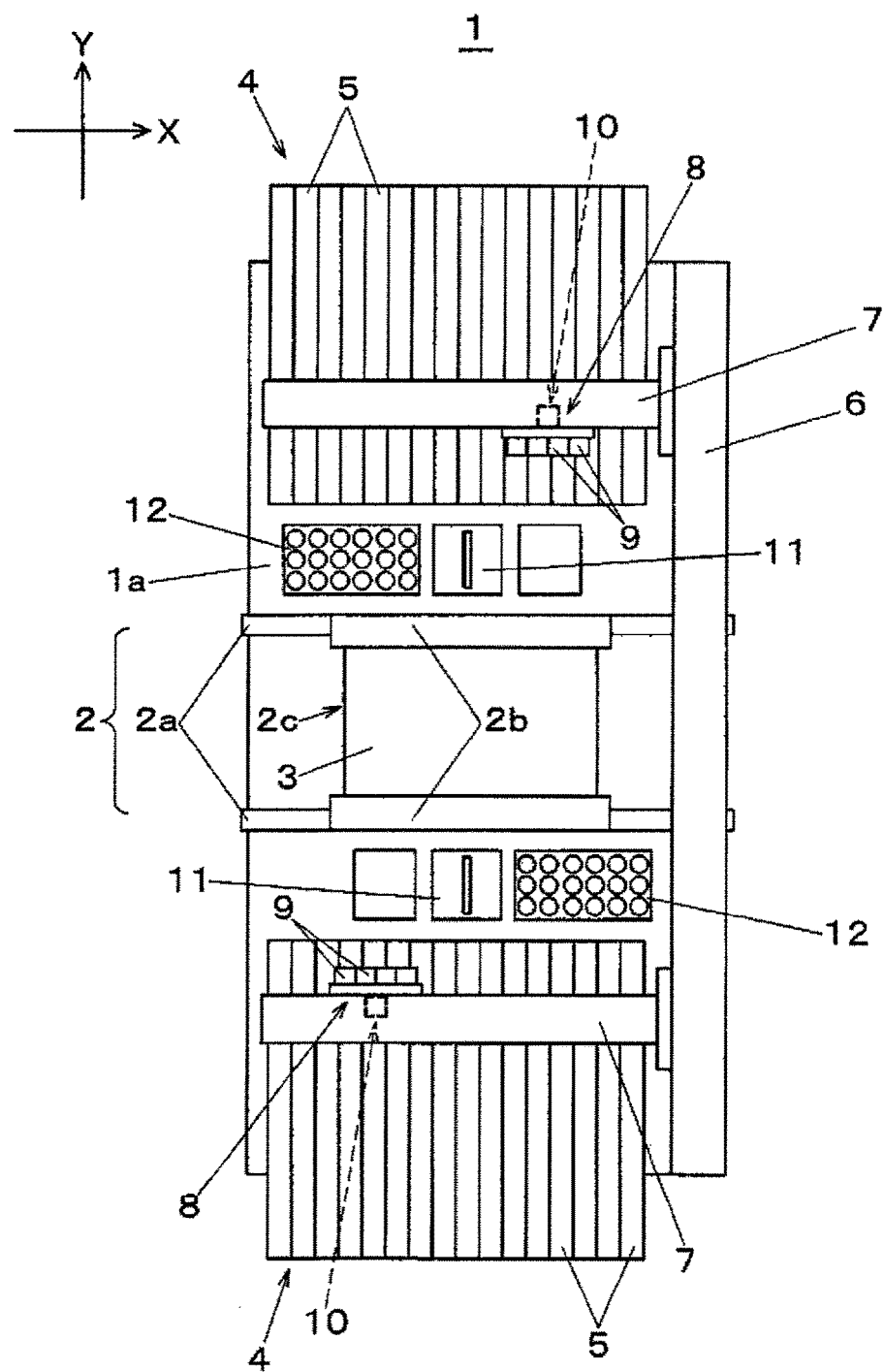
FIG. 1 is a plan view showing a structure of an electronic component mounting device of one embodiment of the present invention.

Now, an embodiment of the present invention will be described below by referring to the drawings. Initially, by referring to FIG. 1, an entire structure of an electronic component mounting device 1 will be described. The electronic component mounting device 1 is used in a component mounting line in which electronic components are mounted on a substrate to produce a mounting substrate and has a function of holding the electronic components by a suction nozzle attached to a mounting head and mounting the electronic components on the substrate. Namely, the component mounting device 1 serves as a device for mounting components which performs a component mounting operation as an operation for mounting the components by taking the substrate as an object.

In FIG. 1, in a central part of a base 1a, a substrate conveyance mechanism 2 is arranged in a direction X (a substrate conveying direction). The substrate conveyance mechanism 2 has a function which conveys a substrate 3 carried-in from an upstream side and positions the substrate 3 on a position of a mounting operation by a below-described component mounting mechanism, and has two conveyance rails 2a arranged in parallel. The substrate conveyance mechanism 2 is provided with a substrate under-support mechanism 2c (see FIG. 3(a) and FIG. 3(b)) which supports the carried-in substrate 3 from below. In upper end parts of the conveyance rails 2a, pressing members 2b are provided which press from above and clamps side end parts of two opposed sides of the substrate 3 elevated by the substrate under-support mechanism 2c.

At both sides of the substrate conveyance mechanism 2, component supply parts 4 are arranged which supply electronic components as objects to be mounted. In the component supply parts 4, a plurality of tape feeders 5 are arranged in parallel. The tape feeder 5 has a function of pitch-feeding the components held by a carrier tape to a taking-out position by a below-described component mounting mechanism. On one end part of an upper surface of the base 1a in the direction X, a Y-axis moving table 6 is arranged. To the Y-axis moving table 6, two X-axis moving tables 7 are connected to freely slide in a direction Y. To the X-axis moving tables 7, mounting heads 8 are attached so as to freely slide in the direction X.

The mounting head 8 is a multiple type head including a plurality of unit holding heads 9 which respectively hold, by a vacuum suction, the electronic components as the objects to be mounted from the tape feeders 5 by suction nozzles for sucking the components (an illustration is omitted) which are attached to nozzle holders 9a provided in lower end parts of the unit holding heads 9. The Y-axis moving table 6 and the X-axis moving tables 7 form a head moving mechanism which moves the mounting heads 8.

By driving the head moving mechanism, the mounting heads 8 move between the component supply parts 4 and the substrate 3 positioned by the substrate conveyance mechanism 2. In the substrate 3, the mounting heads 8 are lifted and lowered to mount the held electronic components on the substrate 3. The mounting heads 8 and the head moving mechanism which moves the mounting heads 8 form the component mounting mechanism which takes out the components from the component supply parts 4 and mounts the components on the substrate 3.

To lower surfaces of the X-axis moving tables 7, substrate recognition cameras 10 are respectively attached which are moved together with the mounting heads 8. When the head moving mechanism is driven to move the substrate recognition camera 10 over the substrate 3 held by the substrate conveyance mechanism 2, the substrate recognition camera 10 picks up an image of a recognition mark formed on the substrate 3. In a moving path of the mounting head 8 between the component supply part 4 and the substrate conveyance mechanism 2, a component recognition camera 11 and a nozzle accommodating part 12 are arranged. When the mounting head 8 which takes out the component from the component supply part 4 passes above the component recognition camera 11 in a prescribed direction to perform a scanning operation, the component recognition camera 11 picks up an image of the component held by the mounting head 8.

In the nozzle accommodating part 12, the plurality of suction nozzles attached to the unit holding heads 9 are accommodated and held so as to correspond to the types of the components. When the mounting head 8 makes an access to the nozzle accommodating part 12 to perform a nozzle exchange operation, the suction nozzle attached to the unit holding head 9 can be exchanged depending on the type of the component as an object.

Figure 2:
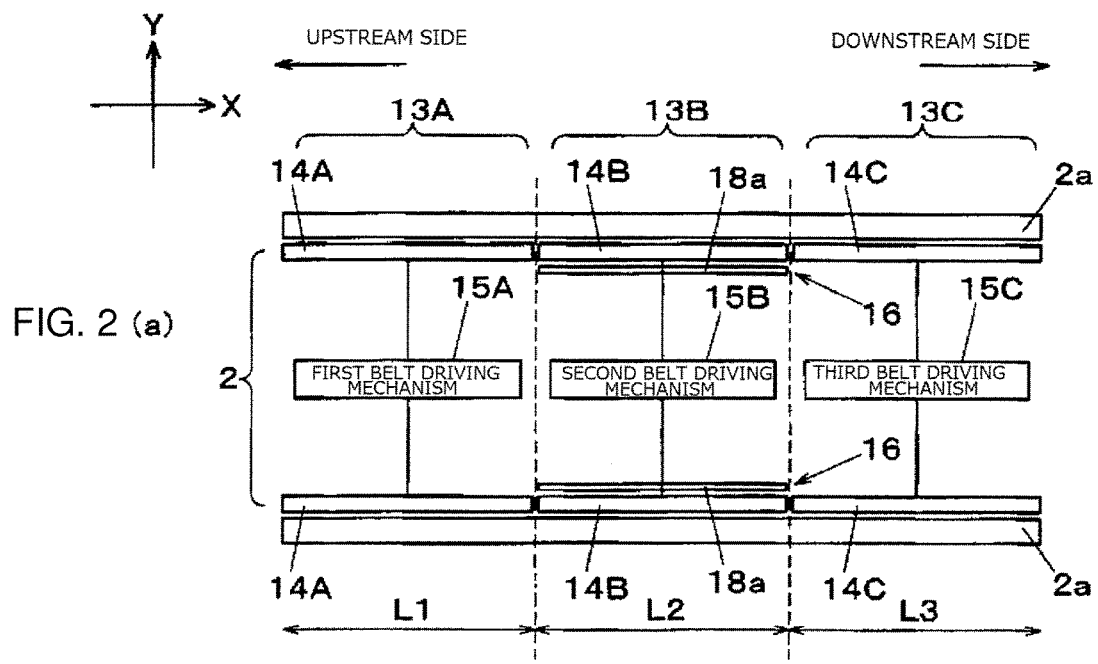
FIG. 2(a) and FIG. 2(b) are plan views of a substrate conveyance mechanism in the electronic component mounting device of the one embodiment of the present invention.
Figure 2:
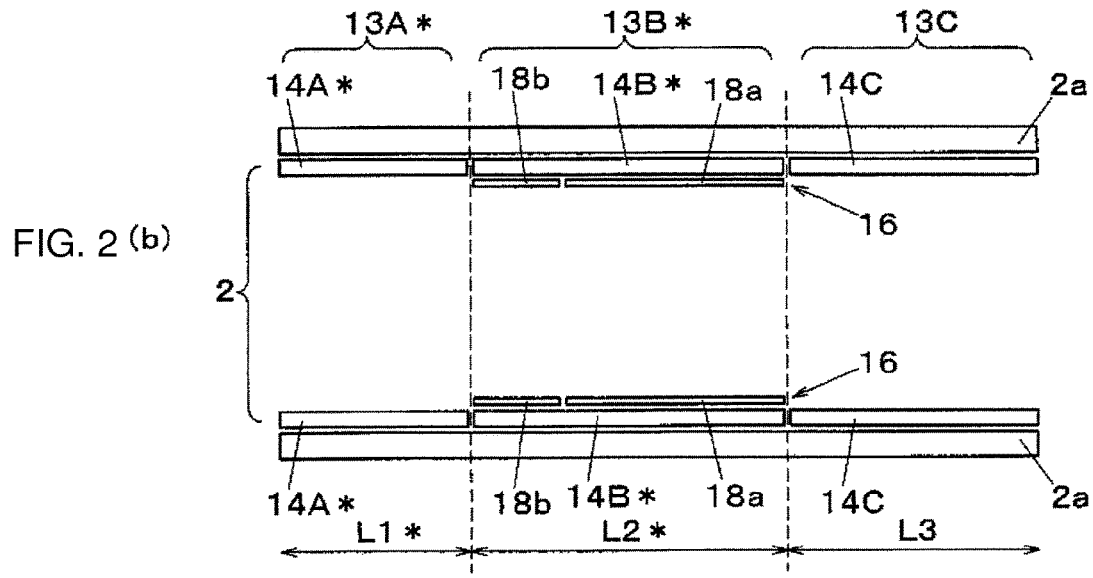

Now, referring to FIGS. 2(a) and 2(b) and FIGS. 3(a) and 3(b), a structure and a function of the substrate conveyance mechanism 2 will be described below. As shown in FIG. 2(a), the substrate conveyance mechanism 2 is provided with the two conveyance rails 2a arranged in parallel with their conveyance width changeable. The substrate conveyance mechanism is divided into three conveyance areas including a stand-by area 13A (an area length L1) where the substrate 3 carried-in from an upstream side device waits, a working area 13B (an area length L2) where the substrate 3 as the object of the component mounting operation by the component mounting mechanism is positioned and held and a delivery area 13C (an area length L3) where the substrate on which the component is mounted is carried out to a downstream side.

Inside the conveyance rails 2a, three conveyance units including a stand-by unit 14A, a working unit 14B and a delivery unit 14C which convey the substrate 3 by conveyance belts wound on a plurality of pulleys are arranged in series correspondingly to the stand-by area 13A, the working area 13B and the delivery area 13C. The stand-by unit 14A, the working unit 14B and the delivery unit 14C are respectively driven by a first belt driving mechanism 15A, a second belt driving mechanism 15B and a third belt driving mechanism 15C (see FIG. 4 and FIG. 5).

Further, in the working unit 14B in the substrate conveyance mechanism 2, a clamp mechanism 16 which clamps the substrate 3 carried-in to the working area 13B is additionally provided. When clamp members are allowed to abut on a lower surface of the substrate 3 so as to press the substrate 3 to the pressing members 2b from below, the substrate 3 is fixed in its position in a vertical direction. In FIG. 2(a) and FIG. 2(b), an illustration of the pressing members 2b is omitted.

In the component mounting line in which the electronic component mounting device 1 shown in the present embodiment is used, since a plurality of types of substrates different in their sizes of length are used as the objects, area lengths of the stand-by area 13A and the working area 13B in the substrate conveyance mechanism 2 can be changed depending on the sizes of length of the substrates. When a substrate 3A (see FIG. 4 and FIG. 6(a)) whose size of length La is small is taken as the object, the area lengths L1 and L2 of the stand-by area 13A and the working area 13B are respectively set to substantially equal dimensions as shown in FIG. 2(a).

Figure 5:
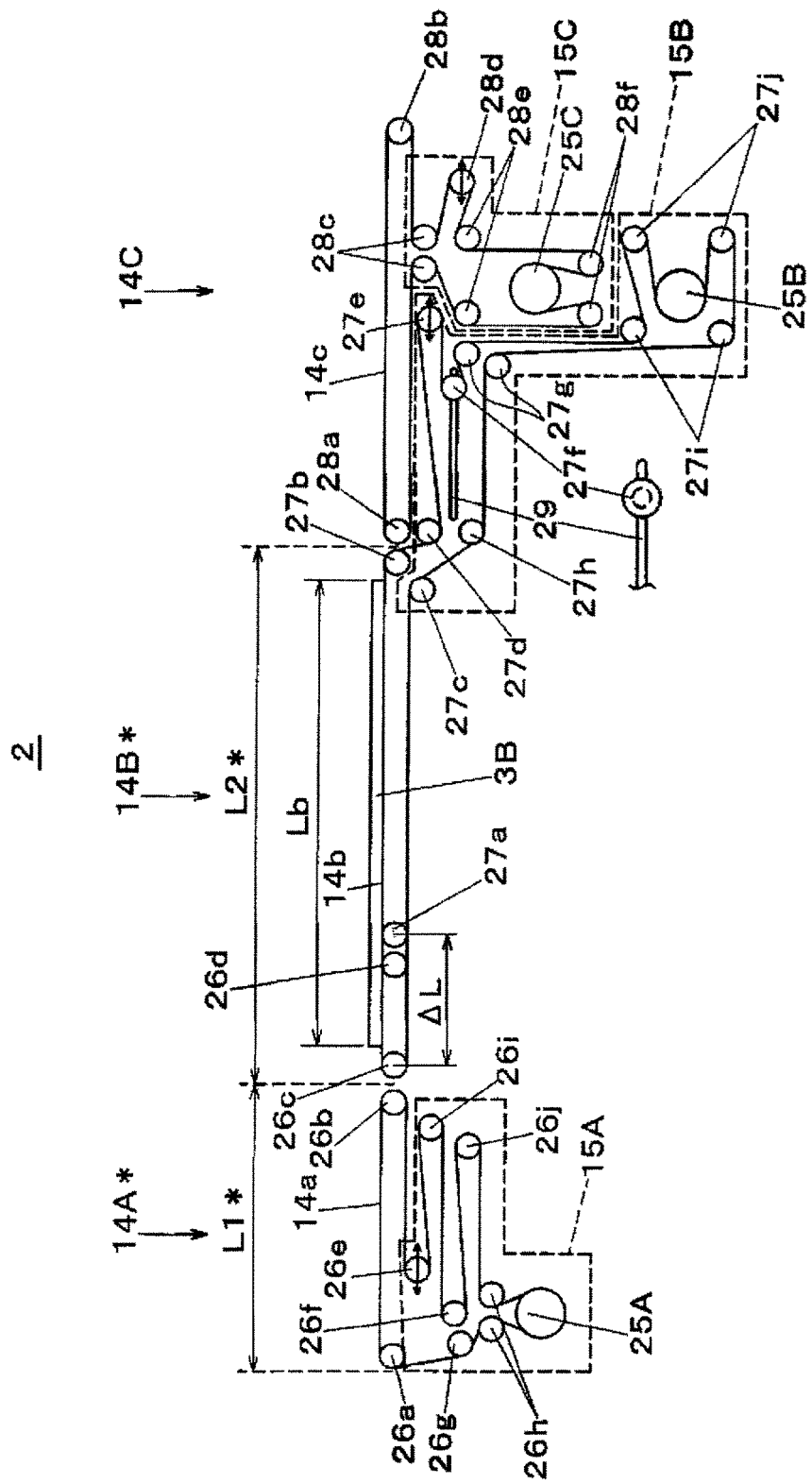
FIG. 5 is a structure explanatory view of the belt driving mechanism of the substrate conveyance mechanism in the electronic component mounting device of the one embodiment of the present invention.
Figure 6:
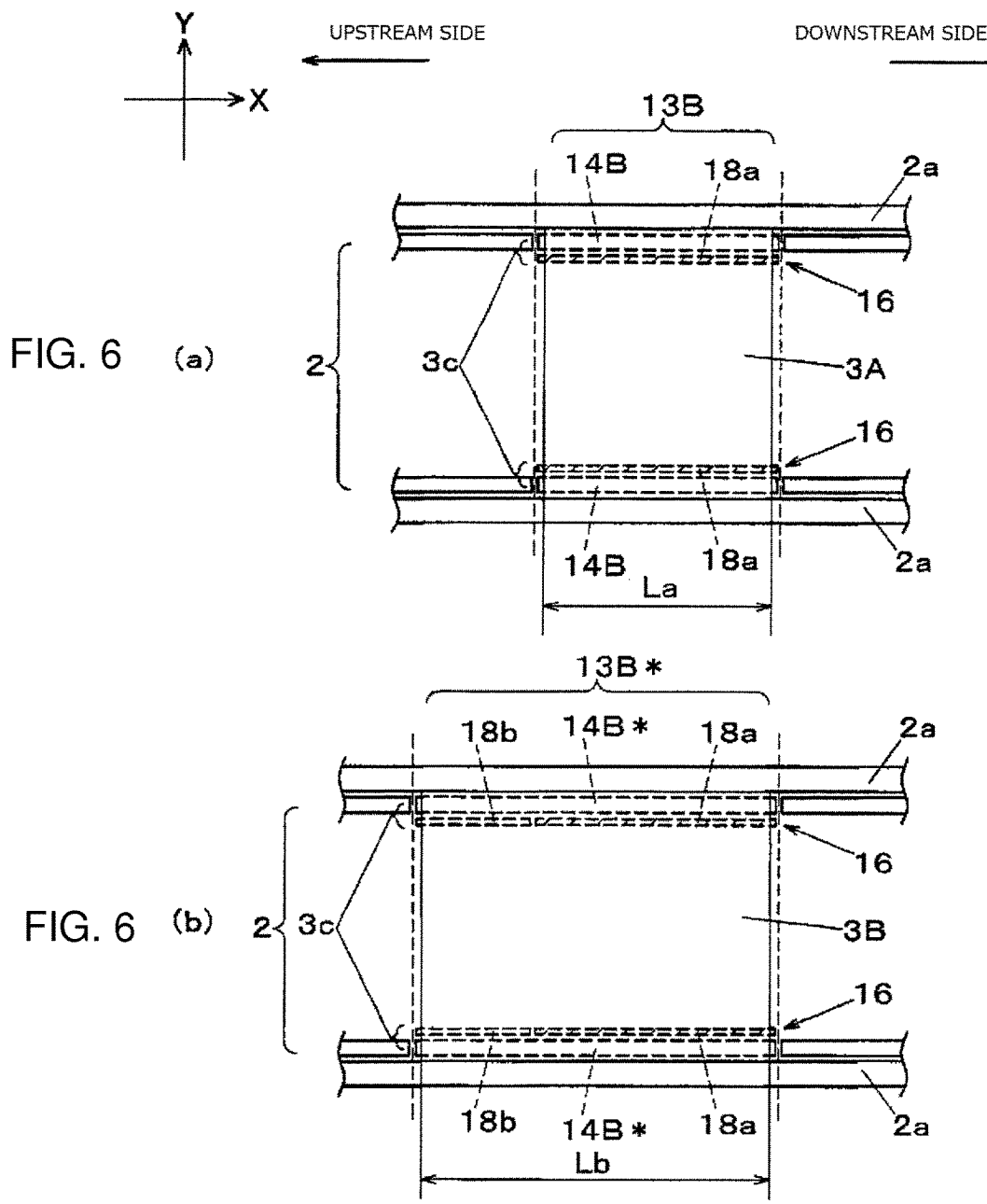
FIG. 6(a) and FIG. 6(b) are function explanatory views of a clamp mechanism of a substrate in the electronic component mounting device of the one embodiment of the present invention.

As compared therewith, when a substrate 3B (see FIG. 5 and FIG. 6(b)) whose size of length Lb is large is taken as the object, the stand-by unit 14A shown in FIG. 2(a) is changed to a stand-by unit 14A* having an area length L1* shorter than the area length L1 as shown in FIG. 2(b). Then, since the stand-by unit 14A is shortened more, the working unit 14B is extended the more and changed to a working unit 14B* having an area length L2* longer than the area length L2. Further, in the clamp mechanism 16, in order to meet the area length L2* of the changed working unit 14B, second clamp members 18b are arranged in the upstream side in addition to first clamp members 18a shown in FIG. 2(a).

Namely, the substrate conveyance mechanism 2 shown in the present embodiment has the structure which includes the working unit 14B which corresponds to the working area 13B where the component mounting operation is performed with the plurality of types (here, the two types) of the substrates 3A and 3B different in their sizes of length set as the objects and in which the area length of the working area is variable in accordance with the sizes of length La and Lb of the substrates 3A and 3B and the stand-by unit 14A corresponding to the stand-by area 13A where the substrates 13A and 13B to be carried-in to the working area 13B are allowed to wait. In the drawings respectively showing the present embodiment, component elements to which "*" is attached respectively show states after the change in order to set the substrate 3B as the object.

Figure 3:
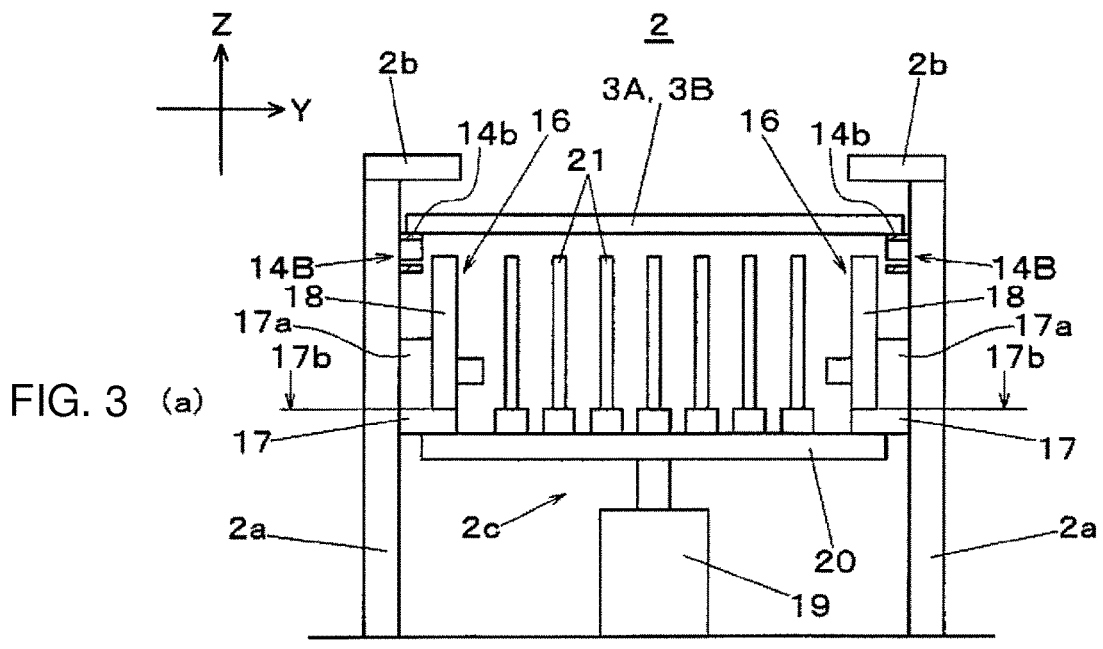
FIG. 3(a) and FIG. 3(b) show sections of the substrate conveyance mechanism and explanatory views of a substrate under-support mechanism in the electronic component mounting device of the one embodiment of the present invention.
Figure 3:
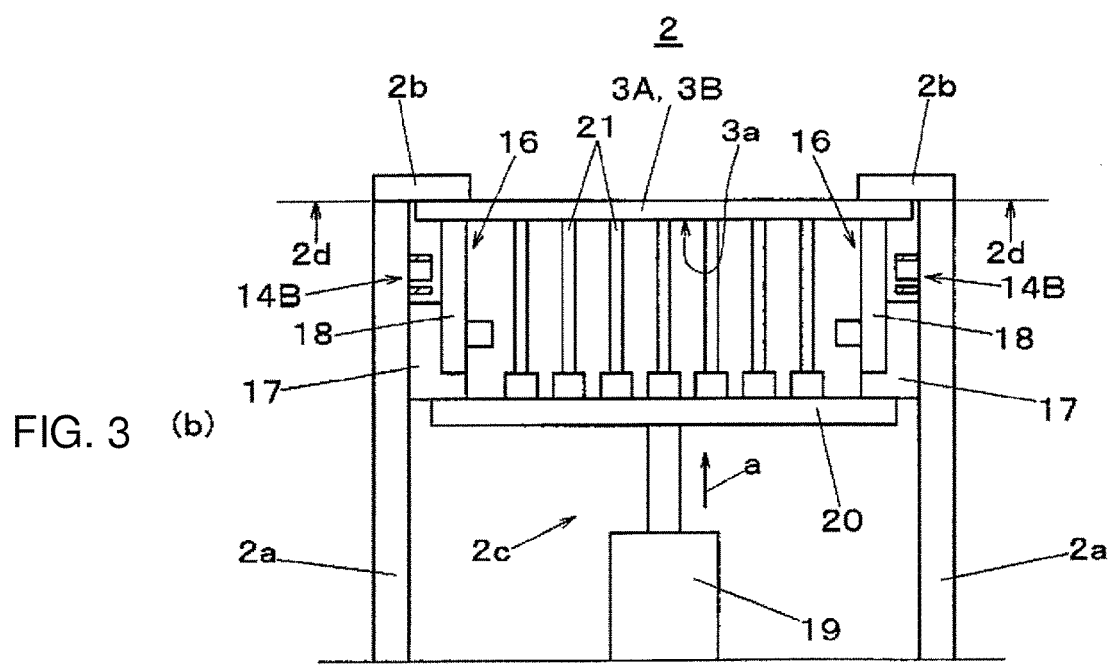

FIGS. 3(a) and 3(b) respectively show vertical sections intersecting at right angles to a substrate conveying direction in the working area 13B. Firstly, FIG. 3(a) shows a state that the substrate 3A or 3B are carried-in to the working area 13B by the working unit 14B. Under this state, both end parts of the substrate 3A or 3B are held by conveyance belts 14b of the working unit 14B. Below the substrate 3A or 3B, the substrate under-support mechanism 2c and the clamp mechanism 16 are in a stand-by state.

The substrate under-support mechanism 2c has a structure that a base part 20 on which a plurality of under-support pins 21 are allowed to stand upright is lifted and lowered by a lifting drive part 19. The clamp mechanism 16 has a structure that a base part 17 having a plate shaped clamp member 18 attached is arranged so as to vertically freely slide along an inner surface of the conveyance rail 2a. The base part 17 is an elongated member in a direction X (a vertical direction on a sheet surface) with a substantially L shape in section. The clamp member 18 is bolted and fixed to an attaching part 17a under a state that a bottom surface is pressed to a height reference plane 17b (see FIG. 7(a) and FIG. 7(b)).

As shown in FIG. 3(b), under a state that the base part 20 is lifted by driving (an arrow a) the lifting drive part 19 to lift the base part 20, upper end parts of the under-support pins 21 abut on and under-support a lower surface 3a of the substrate 3A or 3B. Thus, the substrate 3A or 3B floats from the conveyance belts 14b. Further, in a lifting operation of the base part 20, end parts of the base part 20 abut on the base parts 17 from below, so that the clamp members 18 are lifted together with the base parts 17 to push up the substrate 3A or 3B from a lower surface side. Thus, both side end parts of the substrate 3A or 3B are sandwiched and clamped between lower surfaces 2d of the pressing members 2b and the clamp members.

Figure 4:
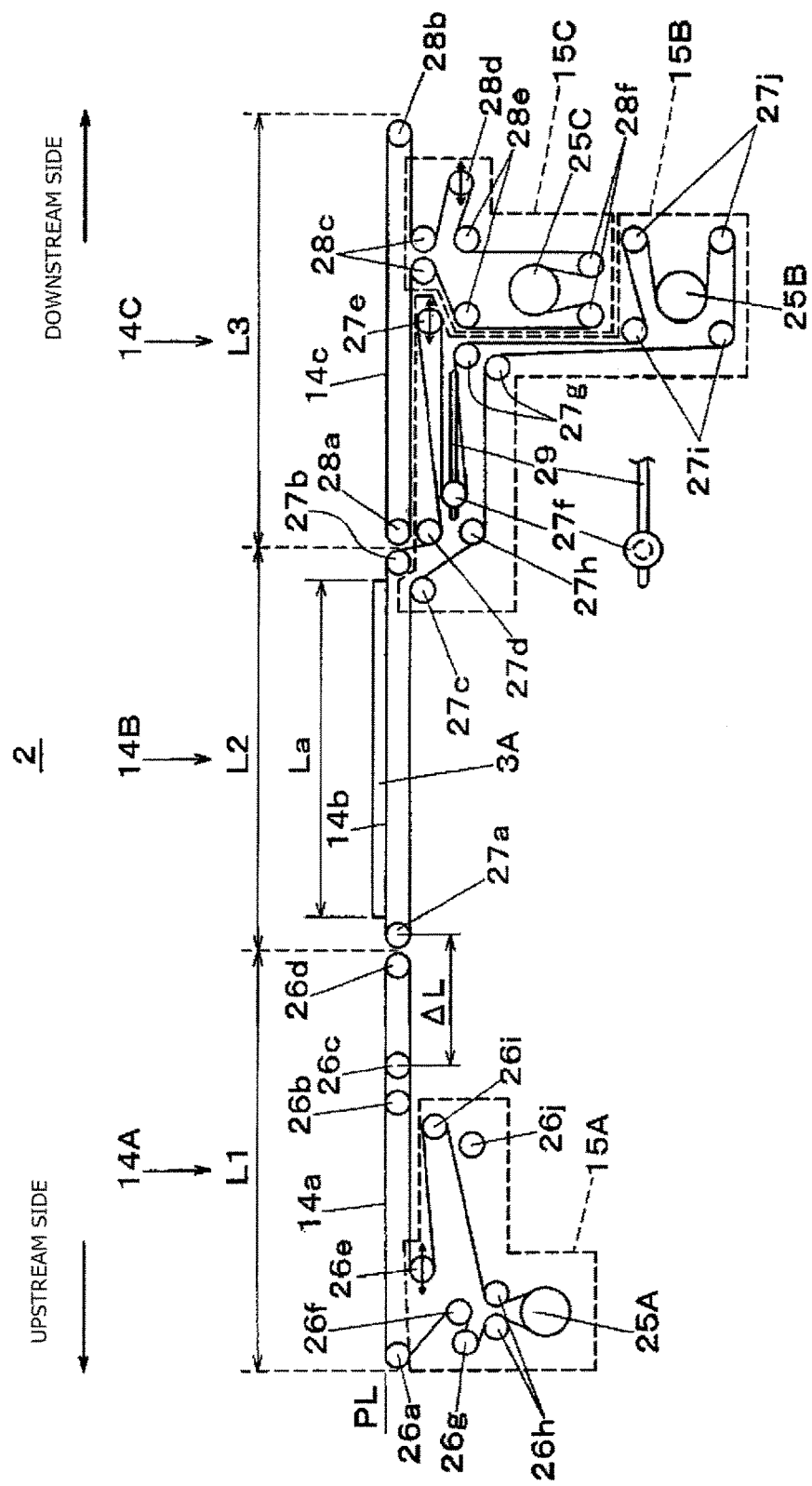
FIG. 4 is a structure explanatory view of a belt driving mechanism of the substrate conveyance mechanism in the electronic component mounting device of the one embodiment of the present invention.

Now, referring to FIG. 4 and FIG. 5, structures of the stand-by unit 14A, the working unit 14B and the delivery unit 14C will be described below. FIG. 4 and FIG. 5 respectively correspond to states shown in FIG. 2(a) and FIG. 2(b). The stand-by unit 14A, the working unit 14B and the delivery unit 14C are provided with the first belt driving mechanism 15A, the second belt driving mechanism 15B and the third belt driving mechanism 15C respectively having belt driving motors 25A, 25B and 25C as rotation and driving sources.

Here, the first belt driving mechanism 15A is arranged in a position biased to the upstream side below the stand-by unit 14A. The second belt driving mechanism 15B is arranged at a position that deviates from under the working unit 14B and is lower than the third belt driving mechanism 15C located under the delivery unit 14C. With such an arrangement, a clear space can be ensured below the working unit 14B in the working area 13B. Thus, flexible arrangement of the clamp mechanism 16 or the substrate under-support mechanism 2c can be secured. The above-described conveyance units respectively have belt conveyance surfaces with the conveyance belts wound on the plurality of pulleys. The belt conveyance surfaces are aligned and arranged on the same conveyance path line PL so that a substrate conveyance surface is formed which is continuous from the upstream side to the downstream side in the substrate conveyance mechanism 2. The structures of the conveyance units will be respectively described below.

Initially, the structure of the stand-by unit 14A will be described below. In the stand-by unit 14A, pulleys 26a, 26b, 26c and 26d are arranged in a horizontal direction from the upstream side so as to meet the conveyance path line PL. The conveyance belt 14a horizontally extended and stretched on upper surfaces of the pulleys 26a and 26d forms the belt conveyance surface in the stand-by unit 14A. The conveyance belt 14a which is turned on the pulley 26d and guided to the upstream side has its tension adjusted by a pulley 26e and reaches one of two paired pulleys 26h through a pulley 26i.

Further, the conveyance belt 14a which is turned on the pulley 26a and guided obliquely and downwardly passes sequentially a pulley 26f and a pulley 26g and then reaches the other pulley 26h. Then, the conveyance belt 14a which passes the two pulleys 26h is wound on a driving pulley of the belt driving motor 25A so as to drive the belt driving motor 25A to normally or reversely rotate. Thus, the conveyance belt 14a is horizontally reciprocated on the belt conveyance surface.

Under this state, the pulleys 26b and 26c are not involved in driving the belt and function as the pulleys on which the conveyance belt is wound only under a state shown in FIG. 5. Further, in a position near a lower part of the pulley 26i, a pulley 26j is arranged. The pulley 26j is not also involved in the driving of the belt under this state and functions as the pulley only under the state shown in FIG. 5. In the above-described structure, the pulley 26e to the pulley 26h and the belt driving motor 25A having the driving pulley form the first belt driving mechanism 15A which drives the conveyance belt 14a in the stand-by unit 14A.

Now, the structure of the working unit 14B will be described below. In the working unit 14B, pulleys 27a and 27b are arranged in a horizontal direction from the upstream side so as to meet the conveyance path line PL. The conveyance belt 14b horizontally extended and stretched on upper surfaces of the pulley 27a and the pulley 27b forms the belt conveyance surface in the working unit 14B. A position of the pulley 27a is arranged with an interval corresponding to a difference of length ΔL between the sizes of length La and Lb in the downstream side from the pulley 26c of the conveyance belt 14a.

The conveyance belt 14b which is turned on the pulley 27a and guided to the downstream side reaches a pulley 27h through a pulley 27c and further reaches one of a pair of pulleys 27g in a lower side. Further, the conveyance belt 14b turned on the pulley 27b and guided downwardly in the downstream side reaches a pulley 27d located above the pulley 27h.

Further, the conveyance belt 14b guided to the downstream side from the pulley 27d has its tension adjusted by a pulley 27e, further, is wound on a pulley 27f and reaches upper one of the pair of pulleys 27g. Here, a position of the pulley 27f is not fixed and its horizontal position is adjustable along an adjusting slot 29 provided in the horizontal direction. Under a state shown herein, the pulley 27f is located in the upstream side in an adjustment range by the adjusting slot 29.

Two conveyance belts 14b passing the one pair of pulleys 27g pass one pair of pulleys 27i arranged below and then are guided in a transverse direction. Further, the conveyance belt 14b wound on one pair of pulleys 27j is wound on a driving pulley of the belt driving motor 25B. The belt driving motor 25B is driven to rotate normally and reversely, so that the conveyance belt 14b is horizontally reciprocated on the belt conveyance surface. In the above-described structure, the pulley 27c to the pulleys 27j and the belt driving motor 25B having the driving pulley form the second belt driving mechanism 15B which drives the conveyance belt 14b in the working unit 14B.

Now, the structure of the delivery unit 14C will be described below. In the delivery unit 14C, pulleys 28a and 28b are arranged in a horizontal direction from the upstream side so as to meet the conveyance path line PL. The conveyance belt 14c horizontally extended and stretched on upper surfaces of the pulleys 28a and 28b forms the belt conveyance surface in the delivery unit 14C. The conveyance belt 14c which is turned on the pulley 28a and guided downwardly and the conveyance belt 14c which is turned on the pulley 28b and guided to the upstream side reach pulleys 28c respectively arranged as a pair.

Then, the conveyance belt 14c guided from the one pulley 28c has its tension adjusted by a pulley 28d and is wound on a driving pulley of the belt driving motor 25C together with the conveyance belt 14c guided from the other pulley 28c via respectively paired pulleys 28e and 28f which are arranged below. The belt driving motor 25C is driven to rotate normally and reversely, so that the conveyance belt 14c is horizontally reciprocated on the belt conveyance surface. In the above-described structure, the pulleys 28c to the pulleys 28f and the belt driving motor 25C having the driving pulley form the third belt driving mechanism 15C which drives the conveyance belt 14c in the delivery unit 14C.

When the type of the substrate as the object to be mounted is changed to the substrate 3B having the size of length Lb as the object in place of the substrate 3A having the size of length La, a belt winding form of the conveyance belt is changed so that the stand-by unit 14A and the working unit 14B are changed to the stand-by unit 14A* and the working unit 14B* shown in FIG. 5.

Namely, initially, in the working unit 14B, the pulley 27a in the upstream side which forms the belt conveyance surface is changed to the pulley 26c. Thus, is formed the working unit 14B* corresponding to the area length L2* which is increased more by the difference of length ΔL from the area length L2. At this time, since an entire length of the conveyance belt 14b is the same before and after the change, a change in length of the conveyance belt 14b corresponding to an increase of the area length is adjusted in such a way that the horizontal position of the pulley 27f in the second belt driving mechanism 15B is slid to the downstream side along the adjusting slot 29.

Further, in accordance with the above-described change of the winding form of the conveyance belt, the stand-by unit 14A is changed to the stand-by unit 14A* corresponding to the area length L1* which is reduced by the difference of length ΔL from the area length L1. The area length is changed in such a way that a pulley 26j which is not used in FIG. 4 is added to a belt winding path of the conveyance belt 14a. Namely, the conveyance belt 14a passing the pulley 26i is wound on the pulley 26f and guided to the pulley 26j, and then, reaches the pulley 26h. Further, the conveyance belt 14a guided from the pulley 26a does not pass the pulley 26f and directly passes the pulley 26g and reaches the pulley 26h. By the change of the belt winding form, a length of the belt is increased in the first belt driving mechanism 15A, so that a decrease of the area length corresponding to the difference of length ΔL is adjusted in the conveyance belt 14a whose entire length is the same.

In the structure of the above-described working unit 14B, the pulley 27b arranged in the downstream side corresponding to a substrate stop position in the working area 13B corresponds to a first pulley which is commonly used when either of the plurality types of substrates 3 (here, the two types of substrates 3A and 3B) is taken as the object. The pulleys 27a and 26c correspond to a plurality of second pulleys which are selectively used in accordance with the sizes of length La and Lb when only any one of the substrates 3A and 3B is taken as the object.

Namely, when the substrate 3A is taken as the object, the pulleys 27a and 27b are used to form the belt conveyance surface. When the substrate 3B is taken as the object, the pulleys 26c and 27b are used to form the belt conveyance surface. Here, since the first pulley commonly used for either type of the substrate is arranged in a position corresponding to the substrate stop position in the working area 13B, a reference position is constantly fixed when an operation is performed. Thus, a setup change operation is easily performed which meets the change of the types of substrates.

Further, in the working unit 14B, when the belt winding form of the conveyance belt 14b having the same belt length which is wound on the plurality of pulleys including the above-described first pulley and the second pulleys is changed, an interval between the first pulley and the second pulleys can be changed in accordance with the area length of the working area 13B. Accordingly, the pulley 27b as the first pulley and the pulleys 26c and 27a as the second pulleys and the pulley 27f provided in the second belt driving mechanism 15B so as to change its position in the horizontal direction form a working area length change part which changes the interval between the first pulley and the second pulleys in accordance with the area length of the working area 13B.

In the structure of the above-described stand-by unit 14A, the pulley 26a arranged in the upstream side corresponds to a third pulley which is commonly used when either of the two types of substrates 3A and 3B is taken as the object. The pulleys 26b and 26d correspond to a plurality of fourth pulleys which are selectively used in accordance with the sizes of length La and Lb when only any one of the substrates 3A and 3B is taken as the object. Namely, when the substrate 3A is taken as the object, the pulleys 26a and 26d are used to form the belt conveyance surface. When the substrate 3B is taken as the object, the pulleys 26a and 26b are used to form the belt conveyance surface.

Further, in the stand-by unit 14A, when the belt winding form of the conveyance belt 14a having the same or uniform belt length which is wound on the plurality of pulleys including the above-described third pulley and the fourth pulleys is changed, an interval between the third pulley and the fourth pulleys can be changed in accordance with the area length of the stand-by area 13A. Accordingly, the pulley 26a as the third pulley and the pulleys 26b and 26d as the fourth pulleys and the pulleys 26j, 26f and 26g used to change the belt winding path in the first belt driving mechanism 15A form a stand-by area length change part which changes the interval between the third pulley and the fourth pulleys in accordance with the area length of the stand-by area 13A.

The above-described pulleys arranged in the working unit 14B and the stand-by unit 14A have structures including a plurality of idlers used to draw the conveyance belts 14a and 14b. At least either of the working area length change part of the working unit 14B and the stand-by area length change part of the stand-by area unit 14A (only the stand-by area length change part of the stand-by unit 14A in an example shown in the present embodiment) includes the pulley 26i as the first idler which is commonly used when either of the substrates 3A and 3B is taken as the object and the pulley 26j as the second idler which is selectively used in accordance with the sizes of length La and Lb when only any one of the substrate 3A and the substrate 3B is taken as the object.

Further, at least either of the working area length change part of the working unit 14B and the stand-by area length change part of the stand-by unit 14A (only the working area length change part of the working unit 14B in an example shown in the present embodiment) includes the pulley 27f as a position variable idler which is selectively arranged in accordance with the sizes of length La and Lb when only any one of the substrates 3A and 3B is taken as the object.

In the example shown in the present embodiment, as the structure of the stand-by area length change part of the stand-by unit 14A, an example is shown that the first idler and the second idler are selectively used in accordance with the sizes of length La and Lb. As the structure of the working area length change part of the working unit 14B, an example is shown that the idler whose position is variable is selectively arranged in accordance with the sizes of length La and Lb. However, whether any of these structures is used can be arbitrarily selected depending on design and layout conditions such as a restriction of a usable space.

Now, by referring to FIG. 6(a), FIG. 6(b), FIG. 7(a) and FIG. 7(b), a structure and a function of the clamp mechanism 16 provided in the substrate conveyance mechanism having the above-described structure will be described below. As described above, in the working unit 14B which corresponds to the working area 13B of the conveyance units respectively corresponding to the conveyance areas set in the substrate conveyance mechanism 2 and in which the component mounting operation is performed for the substrate 3 as the object, the clamp mechanism 16 is provided which fixes the substrate 3 carried-in to the working area 13B and positioned in a prescribed working position.

As shown in FIG. 6(a) and FIG. 6(b), in both the side end parts parallel to the direction X as the substrate conveying direction in the lower surface of the substrate 3, clamp parts 3c are set along the direction X which are located inside the working unit 14B. When the substrate 3 is carried-in to the working area 13B, the clamp mechanism 16 allows the clamp members 18 (see FIG. 3(a) and FIG. 3(b)) to abut on the clamp parts 3c from below to push up the substrate so as to hold the substrate between the pressing members 2b and the clamp members 18 and clamp and fix the substrate 3.

Figure 7:
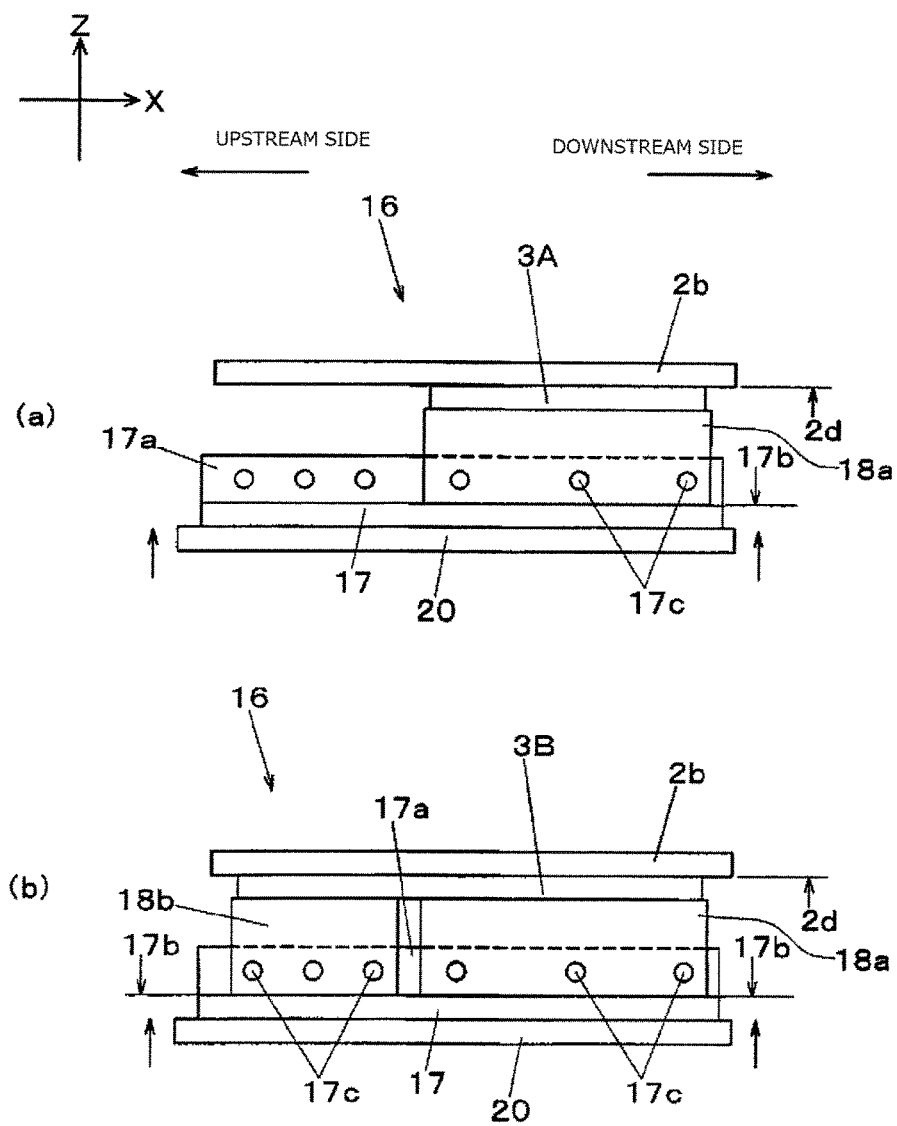
FIG. 7(a) and FIG. 7(b) are function explanatory views of the clamp mechanism of the substrate in the electronic component mounting device of the one embodiment of the present invention.

FIG. 6(a) shows a case that the substrate 3A having the size of length La is taken as the object. In this case, as the clamp members 18, only the first clamp members 18a corresponding to the size of length La are used. Namely, as shown in FIG. 7(a), only the first clamp members 18a are fastened and fixed to the attaching parts 17a of the base parts 17 by the fixing bolts 17c. Ina clamp process, when the base part 20 is lifted, the first clamp members 18a abut on the lower surface of the substrate 3A to pushup the substrate 3A, so that both the side end parts of the substrate 3A are sandwiched, clamped and fixed between the lower surfaces 2d of the pressing members 2b and the first clamp members 18a.

Further, FIG. 6(b) shows a case that the substrate 3B having the size of length Lb is taken as the object. In this case, in order to meet the size of length Lb, as the clamp members 18, the second clamp members 18b are additionally attached together with the first clamp members 18a in the upstream side of the clamp members 18a in the substrate conveying direction. Namely, as shown in FIG. 7(b), to the attaching parts 17a of the base parts 17, the first clamp members 18a and the second clamp members 18b are fastened and fixed by the fixing bolts 17c. A length of the second clamp member 18b is determined in accordance with an added length required to cover the size of length Lb of the substrate 3B. Then, in a clamp process, when the base part 20 is lifted, the first clamp members 18a and the second clamp members 18b abut on the lower surface of the substrate 3B to pushup the substrate 3B, so that both the side end parts of the substrate 3B are sandwiched, clamped and fixed between the lower surfaces 2d of the pressing members 2b and the first and second clamp members 18a and 18b.

In the above-described structure, the clamp members 18 provided in the clamp mechanism 16 have forms including the first clamp members 18a commonly used when either of the substrates 3A and 3B is taken as the object and the attachable and detachable second clamp members 18b which are selectively used in addition to the first clamp members 18a depending on the sizes of length La and Lb when only any one of the substrates 3A and 3B is taken as the object. The second clamp members 18b are attached more upstream in the substrate conveying direction than the first clamp members 18a in the base parts 17 so as to meet a design and layout that the substrate stop position in the working area 13B is located in the downstream side as a reference. Thus, the first clamp members 18a are used under a state that they are constantly fixed and attached. Thus, the setup change operation is easily performed which meets the change of the types of substrates.

In the above-described embodiment, an example is shown that the substrate 3 as the object of the operation includes the two types of substrates 3A and 3B having the sizes of length La and Lb. However, the types of the substrates are not limited to the two types and three or more types of substrates may be taken as the objects. In this case, the second pulleys and the fourth pulleys which are individually and selectively used may be more added, the number of corresponding idlers may be increased or a movement range of the position variable idler may be enlarged so as to meet the above-described case. Further, for the clamp mechanism 16, a plurality of types of second clamp members 18b having different lengths may be prepared respectively for the types of the added substrates so as to meet the above-described case.

As described above, in the substrate conveyance mechanism shown in the present embodiment, the substrate conveyance mechanism 2 is formed in such a way that the working unit 14B which corresponds to the working area 13B where the plurality of types of substrates 3 having the different sizes of length are used as the objects to perform the component mounting operation and which has the area length L2 of the working area 13B variable in accordance with the size of length and the stand-by unit 14A corresponding to the stand-by area 13A where the substrate 3 to be carried-in to the working area 13B is allowed to wait are arranged in series. In the substrate conveyance mechanism 2, a structure of the pulleys on which the conveyance belt 14b is wound in the working unit 14B includes the first pulley commonly used when either of the plurality of types of substrates 3 is taken as the object and the plurality of second pulleys selectively used in accordance with the sizes of length when only any one of the plurality of types of substrates is taken as the object.

Further, in the working unit 14B, the belt winding form of the conveyance belt 14b having the same belt length which is wound on the plurality of pulleys including the first pulley and the second pulleys is changed so that the interval between the first pulley and the second pulleys is changed in accordance with the area length L2 of the working area 13B. Thus, the change of the types of substrates performed when the plurality of types of substrates 3 having the different lengths are taken as the objects to be operated can be easily made without requiring an exchange of the conveyance unit such as the working unit 14B.

Further, in the working unit 14B in which the area length L2 of the working area 13B is variable, the clamp mechanism 16 is provided in which the clamp members 18 are allowed to abut on the clamp parts 3c set in both the side end parts parallel to the substrate conveying direction in the lower surfaces of the carried-in substrates 3A and 3B along the substrate conveying direction from below to clamp and fix the substrate. The clamp members 18 have forms including the first clamp members 18a commonly used when either of the substrates 3A and 3B is taken as the object and the attachable and detachable second clamp members 18b selectively used in accordance with the sizes of length in addition to the first clamp members 18a when only one of the substrates 3A and 3B is taken as the object. Thus, the change of the types of substrates performed when the plurality of types of substrates having the different lengths are taken as the objects to be operated can be also easily made without replacing the clamp mechanism 16 by another clamp mechanism.

In the above-described embodiment, as the component mounting device which performs the component mounting operation with the substrate taken as the object, is shown an example of the electronic component mounting device 1 which mounts the electronic components on the substrate 3. However, an object to which the present invention is applied is not limited to the electronic component mounting device 1. Namely, a device, may be set as an object to which the present invention is applied, which is used in the component mounting line that the electronic components are mounted on the substrate 3 to produce the mounting substrate and which takes the substrate 3 conveyed by the substrate conveyance mechanism 2 having the above-described structure as the object to perform the component mounting operation.

This application is based on Japanese Patent Application (JPA No. 2013-044970) filed on Mar. 7, 2013 and contents thereof are incorporated herein as reference.

INDUSTRIAL APPLICABILITY

The substrate conveyance mechanism and the component mounting device of the present invention can effectively easily perform the change of the types of substrates when the plurality of types of substrates having the different lengths are taken as the objects without requiring an exchange of the conveyance unit, and is available to an electronic component mounting field that the electronic components are mounted on the substrate.

REFERENCE SIGNS LIST

1 . . . electronic component mounting device
2 . . . substrate conveyance mechanism
2a . . . conveyance rail
2b . . . pressing member
2c . . . substrate under-support mechanism
3, 3A, 3B . . . substrate
3c . . . clamp part
13A . . . stand-by area
13B . . . working area
13C . . . delivery area
14A . . . stand-by unit
14B . . . working unit 14C . . . delivery unit
14a, 14b, 14c . . . conveyance belt
15A . . . first belt driving mechanism
15B . . . second belt driving mechanism
15C . . . third belt driving mechanism
16 . . . clamp mechanism
17 . . . base part
18 . . . clamp member
18a . . . first clamp member
18b . . . second clamp member

The invention claimed is:

1. A substrate conveyance mechanism comprising
a plurality of conveyance units arranged in series which convey a plurality of types of substrates having different length dimensions from one another by a conveyance belt wound on a plurality of pulleys, wherein
the conveyance units at least comprise:
a stand-by unit with pulleys wherein the stand-by unit corresponds to a stand-by area where a substrate of one of the plurality of types of substrates is allowed to wait before being conveyed to a working area,
a working unit with pulleys wherein the working unit corresponds to the working area where a component mounting operation is performed with the substrate that is conveyed to the working area, an area length dimension of the working area being variable in accordance with a length dimension of the substrate that is conveyed to the working area, wherein
the pulleys of the working unit include a first pulley commonly used when any substrate of the plurality of types of substrates is conveyed and a plurality of second pulleys wherein one of the plurality of second pulleys is selectively used in accordance with the length dimension of the substrate conveyed, and
a working area length dimension change part that accommodates changing an interval between the first pulley and the selected one of the plurality of second pulleys in accordance with the area length dimension of the working area by changing a belt winding path of the conveyance belt having a same belt length and wound on the plurality of pulleys including the first pulley and the second pulleys in the working unit.

2. The substrate conveyance mechanism according to claim 1, wherein
the first pulley is arranged correspondingly to a substrate stop position in the working area,
the pulleys of the stand-by unit include a third pulley commonly used when any of the plurality of types of substrates is conveyed, and a plurality of fourth pulleys which are respectively arranged adjacently to the plurality of second pulleys, paired with the second pulleys and selectively used, and
further, a stand-by area length change part that changes an interval between the third pulley and the fourth pulleys in accordance with the area length of the stand-by area by changing a belt winding path of the conveyance belt having a same belt length and wound on the plurality of pulleys including the third pulley and the fourth pulleys in the stand-by unit is provided.

3. The substrate conveyance mechanism according to claim 2, wherein
the pulleys of the working unit and the stand-by unit include a plurality of idlers used to draw the conveyance belt, and
at least either of the working area length change part and the stand-by area length change part includes a first idler commonly used when any of the plurality of types of substrates is conveyed and a second idler selectively used in accordance with the length dimension of the substrate that is conveyed when only any one of the plurality of types of substrates is conveyed.

4. The substrate conveyance mechanism according to claim 2, wherein
the pulleys of the working unit and the stand-by unit include a plurality of idlers used to draw the conveyance belt, and
at least either of the working area length change part and the stand-by area length change part includes a position variable idler selectively rearranged in accordance with one of the plurality of types of substrates of a specified length, different from any other of the plurality of types of substrates is conveyed.

5. A component mounting device used in a component mounting line which mounts an electronic component on a substrate to produce a mounting substrate and performs a component mounting operation to the substrate, the component mounting device comprising:
a substrate conveyance mechanism according to claim 1; and
a mechanism for a mounting operation which performs the component mounting operation to the substrate conveyed by the substrate conveyance mechanism.

* * * * *